（12） United States Patent
Mashimo et al.

(10) Patent No.: US 10,818,538 B2
(45) Date of Patent: Oct. 27, 2020

(54) WAFER HOLDING MECHANISM FOR ROTARY TABLE AND METHOD AND WAFER ROTATING AND HOLDING DEVICE

(71) Applicant: MIMASU SEMICONDUCTOR INDUSTRY CO., LTD., Takasaki-shi, Gunma (JP)

(72) Inventors: Ikuo Mashimo, Takasaki (JP); Masaki Tamura, Takasaki (JP); Hideaki Nagai, Takasaki (JP)

(73) Assignee: MIMASU SEMICONDUCTOR INDUSTRY CO., LTD., Takasaki-Shi, Gunma (JP)

( * ) Notice: Subject to any disclaimer, the term of this patent is extended or adjusted under 35 U.S.C. 154(b) by 65 days.

(21) Appl. No.: 16/302,859

(22) PCT Filed: May 18, 2017

(86) PCT No.: PCT/JP2017/018695
§ 371 (c)(1),
(2) Date: Nov. 19, 2018

(87) PCT Pub. No.: WO2017/204082
PCT Pub. Date: Nov. 30, 2017

(65) Prior Publication Data
US 2019/0295879 A1    Sep. 26, 2019

(30) Foreign Application Priority Data

May 24, 2016  (JP) .................................. 2016-103243

(51) Int. Cl.
*B23Q 3/00*   (2006.01)
*H01L 21/687*   (2006.01)
(Continued)

(52) U.S. Cl.
CPC ........ *H01L 21/6875* (2013.01); *H01L 21/027* (2013.01); *H01L 21/304* (2013.01); *H01L 21/306* (2013.01); *H01L 21/68728* (2013.01)

(58) Field of Classification Search
CPC . H01L 21/6875; H01L 21/027; H01L 21/304; H01L 21/306; H01L 21/68728
See application file for complete search history.

(56) References Cited

U.S. PATENT DOCUMENTS 5,421,893 A * 6/1995 Perlov ............... H01L 21/67115
                                                    118/725
5,676,360 A * 10/1997 Boucher .................. B23Q 1/52
                                                    269/74
(Continued)

FOREIGN PATENT DOCUMENTS

JP    H09-107023 A    4/1997
JP    2004115872 A    4/2004
(Continued)

*Primary Examiner* — Lee D Wilson
(74) *Attorney, Agent, or Firm* — McGlew and Tuttle, P.C.

(57) ABSTRACT

Provided are a wafer holding mechanism for a rotary table and a method and a wafer rotating and holding device, which enable change of a holding position of the wafer during spin processing while maintaining the posture of the wafer, enable reduction of marks of outer peripheral pins due to etching, and enable reduction of insufficient cleaning or uneven cleaning. The wafer holding mechanism for a rotary table comprises a rotary table configured to hold a wafer on an upper surface thereof, and a plurality of movable outer peripheral pins provided in the rotary table and configured to hold an outer periphery of the wafer. The plurality of movable outer peripheral pins comprise a plurality of first movable outer peripheral pins and a plurality of second movable outer peripheral pins configured to hold the wafer at positions different from positions at which the wafer is held by the first movable outer peripheral pins. Holding (Continued)

positions of the wafer are changed by switching holding of the wafer by the first movable outer peripheral pins and the second movable outer peripheral pins during wafer processing.

3 Claims, 4 Drawing Sheets

(51) Int. Cl.
*H01L 21/304* (2006.01)
*H01L 21/306* (2006.01)
*H01L 21/027* (2006.01)

(56) References Cited

U.S. PATENT DOCUMENTS

| | | | |
|---|---|---|---|
| 6,190,113 B1 * | 2/2001 | Bui | H01L 21/68742 414/672 |
| 6,305,677 B1 * | 10/2001 | Lenz | H01L 21/6831 269/13 |
| 6,390,901 B1 * | 5/2002 | Hiyama | B24B 37/11 451/285 |
| 7,056,392 B1 | 6/2006 | Kuroki et al. | |
| 9,269,605 B2 * | 2/2016 | Miyazaki | H01L 21/68728 |
| 2004/0159343 A1 | 8/2004 | Shimbara et al. | |
| 2008/0242101 A1 | 10/2008 | Tsuchiya et al. | |
| 2009/0032498 A1 | 2/2009 | Tsuchiya et al. | |
| 2014/0299166 A1 | 10/2014 | Furuya et al. | |
| 2019/0295879 A1 * | 9/2019 | Mashimo | H01L 21/6875 |

FOREIGN PATENT DOCUMENTS

| | | |
|---|---|---|
| JP | 2004241492 A | 8/2004 |
| JP | 2008-103521 A | 5/2008 |
| JP | 4111479 B2 | 7/2008 |
| JP | 4257816 B2 | 4/2009 |
| JP | 2010130018 A | 6/2010 |
| JP | 2010130021 A | 6/2010 |
| JP | 4625495 B2 | 2/2011 |
| JP | 4364242 B2 | 6/2016 |

* cited by examiner

WAFER HOLDING MECHANISM FOR ROTARY TABLE AND METHOD AND WAFER ROTATING AND HOLDING DEVICE

TECHNICAL FIELD

The present invention relates to a wafer holding mechanism for a rotary table and a method in a wafer rotating and holding device, and to a wafer rotating and holding device.

BACKGROUND ART

Hitherto, in semiconductor manufacturing processes, there are an increasing number of steps (also called "spin processes") in which various kinds of processing are performed while a semiconductor wafer made of, for example, silicon is rotated, such as spin etching, spin drying, and spin coating. As specific devices, there are known wafer rotating and holding devices such as a spin etching device, a spin drying device, and a spin coating device. Further, as examples of processing to be performed on a wafer surface in manufacturing processes for a device, there can be given, in addition to etching processing for removing a damaged layer after back-grinding, applying developer to the wafer, developing processing on the wafer, which has a surface that has circuit patterns exposed thereon and is applied with developer, and which is printed with a semiconductor circuit, cleaning the wafer surface, and the like. As such a wafer rotating and holding device and method used for performing spin processing on a wafer, there are given, for example, devices and methods described in Patent Documents 1 to 4.

FIG. 5 is a schematic diagram for illustrating a wafer rotating and holding device of the related art, and FIG. 6 is an enlarged view of a main part for illustrating details of a driver of FIG. 5. As illustrated in FIG. 5 and FIG. 6, a wafer W on a rotary table 32 in a wafer rotating and holding device 30 of the related art is held by three outer peripheral pins made up of one movable pin 34 and two fixed pins 36. Support pins for supporting a lower surface of the wafer W are each denoted by a reference symbol 40 in FIG. 5.

When the wafer W is loaded, the movable pin 34 is opened outward to set the wafer W and is then closed, thereby pressing the wafer W toward the fixed pins 36 to hold the wafer W. Once the wafer W is held, spin processing is performed under this state and, after the spin processing is completed, the wafer W is taken out by opening the movable pin 34. A force to drive the movable pin 34 is transmitted from the outside while the spin is stopped, and a cylinder 38 mounted to a non-rotary structure is pushed up to open/close the movable pin 34. During the spin processing, the movable pin 34, which has a hinged structure, presses the wafer W toward the fixed pins 36 with a spring at a pressure that is kept constant throughout the duration of the spin processing to hold the wafer W.

With the method of the related art described above in which the wafer W placed on the rotary table 32 is fixed with the outer peripheral pins, positions at which the outer peripheral pins hold the wafer W are constant during processing, and resultant problems include pin marks left in the held portions by etching, insufficient cleaning in contact portions, and fluctuations due to blocks presented by the pins in the progress of processing to the outer periphery of the wafer W.

PRIOR ART DOCUMENTS

Patent Documents

Patent Document 1: JP 4625495 B2
Patent Document 2: JP 4111479 B2
Patent Document 3: JP 4257816 B2
Patent Document 4: JP 4364242 B2

SUMMARY OF THE INVENTION

Problems to be Solved by the Invention

The present invention has been made in view of the related art described above, and an object of the present invention is to provide a wafer holding mechanism for a rotary table and a method, and a wafer rotating and holding device, which enable change of holding positions of the wafer during spin processing while maintaining the posture of the wafer, enable reduction of marks of outer peripheral pins due to etching, and enable reduction of insufficient cleaning or uneven cleaning, by using a plurality of movable outer peripheral pins and switching the movable outer peripheral pins which hold the wafer.

Means for Solving Problems

In order to solve the above-mentioned problem, a wafer holding mechanism for a rotary table according to the present invention is a wafer holding mechanism for a rotary table of a wafer rotating and holding device, and comprises: a rotary shaft; a rotary table placed on an end of the rotary shaft and configured to hold a wafer on an upper surface of the rotary table; a drive motor configured to supply motive power to the rotary shaft; and a plurality of movable outer peripheral pins provided in the rotary table and configured to hold an outer periphery of the wafer, wherein the plurality of movable outer peripheral pins comprise: a plurality of first movable outer peripheral pins; and a plurality of second movable outer peripheral pins, which are configured to hold the wafer at positions different from holding positions of the wafer by the plurality of first movable outer peripheral pins, wherein the plurality of second movable outer peripheral pins are configured to avoid holding the wafer during a period in which the plurality of first movable outer peripheral pins are holding the wafer, and the plurality of first movable outer peripheral pins are configured to avoid holding the wafer during a period in which the plurality of second movable outer peripheral pins are holding the wafer, and wherein holding positions of the wafer are changed by switching holding by the plurality of first movable outer peripheral pins and holding by the plurality of second movable outer peripheral pins during processing of the wafer.

It is preferred that the holding of the wafer by the plurality of movable outer peripheral pins is controlled with a solenoid, which is provided inside the rotary table.

A wafer holding method for a rotary table according to the present invention comprises using the above-mentioned wafer holding mechanism for the rotary table to hold the wafer.

A wafer rotating and holding device according to the present invention comprises the above-mentioned wafer holding mechanism for the rotary table.

It is preferred that the wafer rotating and holding device further comprises a spin processing mechanism.

Advantageous Effects of the Invention

According to the present invention, there is provided a remarkable effect of enabling provision of the wafer holding mechanism for the rotary table and the method, and the wafer rotating and holding device, which enable change of holding positions of the wafer during spin processing while maintaining the posture of the wafer, enable reduction of marks of outer peripheral pins due to etching, and enable reduction of insufficient cleaning or uneven cleaning, by using a plurality of movable outer peripheral pins and switching the movable outer peripheral pins which hold the wafer.

MODES FOR CARRYING OUT THE INVENTION

An embodiment of the present invention is described below, but the embodiment is described as an example, and hence it is to be understood that various modifications may be made thereto without departing from the technical idea of the present invention. In addition, the same members are denoted by the same reference symbols.

Figure 1:
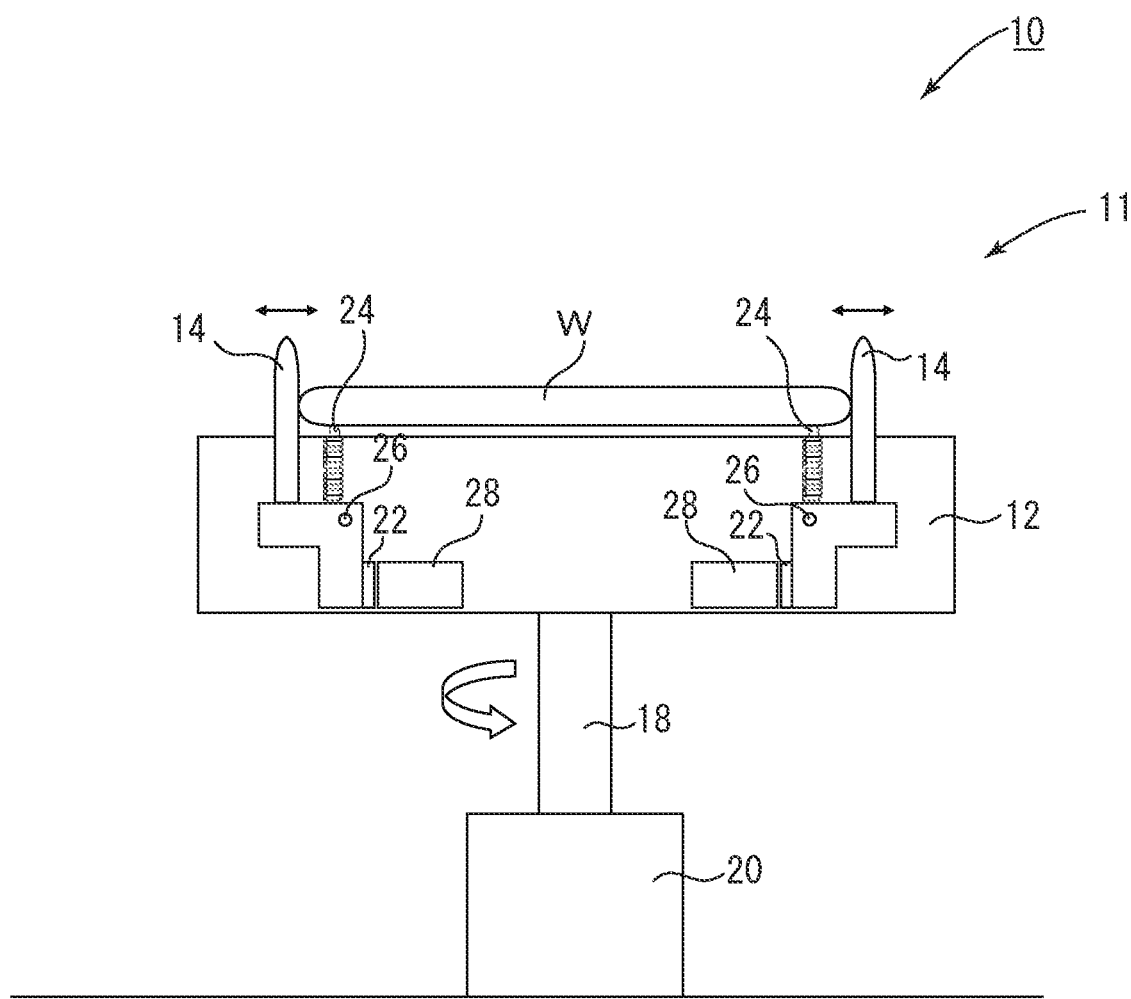
FIG. 1 is a schematic diagram for illustrating one embodiment of a wafer rotating and holding device, which comprises a wafer holding mechanism for a rotary table according to the present invention.
Figure 2:
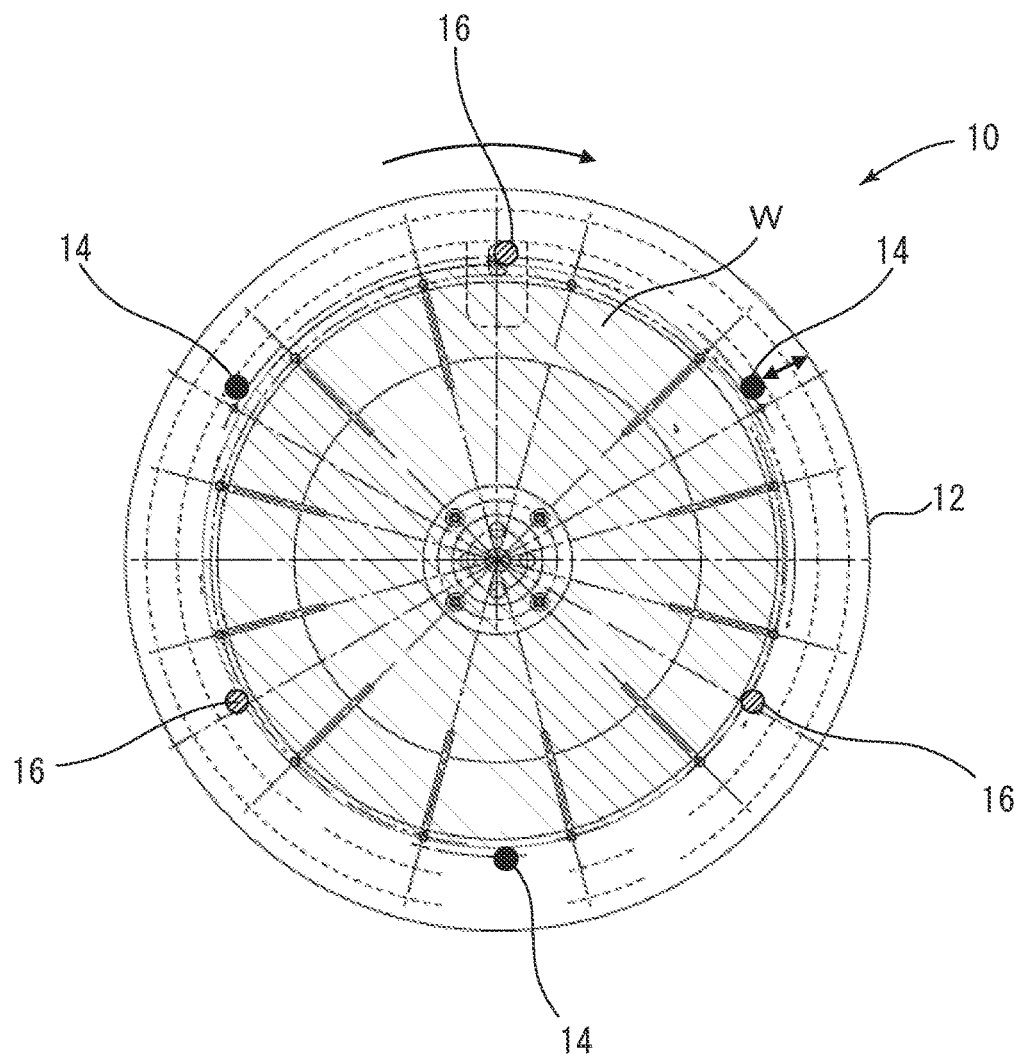
FIG. 2 is an enlarged view of one main part of the wafer rotating and holding device, which comprises the wafer holding mechanism for the rotary table according to the present invention.

A wafer holding mechanism for a rotary table according to the present invention is denoted by a reference symbol 10 in FIG. 1 and FIG. 2. The wafer holding mechanism 10 for the rotary table is a wafer holding mechanism for a rotary table of a wafer rotating and holding device 11, and comprises: a rotary shaft 18; a rotary table 12 placed on an end of the rotary shaft 18 and configured to hold a wafer W on an upper surface of the rotary table 12; a drive motor 20 configured to supply motive power to the rotary shaft 18; and a plurality of movable outer peripheral pins provided in the rotary table 12 and configured to hold an outer periphery of the wafer. The plurality of movable outer peripheral pins comprise: a plurality of first movable outer peripheral pins 14; and a plurality of second movable outer peripheral pins 16, which are configured to hold the wafer W at positions different from holding positions of the wafer W by the plurality of first movable outer peripheral pins 14. In the wafer holding mechanism 10 for the rotary table according to the present invention, the second movable outer peripheral pins 16 are configured to avoid holding the wafer W during a period in which the first movable outer peripheral pins 14 are holding the wafer W, the first movable outer peripheral pins 14 are configured to avoid holding the wafer W during a period in which the second movable outer peripheral pins 16 are holding the wafer W, and holding positions of the wafer W are changed by switching holding by the first movable outer peripheral pins 14 and the second movable outer peripheral pins 16 during processing of the wafer W. In FIG. 1, support pins for supporting a lower surface of the wafer W are each denoted by a reference symbol 24.

FIG. 2 is a plan view for illustrating details of a driver in an example of the wafer rotating and holding device 11, which comprises the wafer holding mechanism 10 for the rotary table according to the present invention. In FIG. 2, three first movable outer peripheral pins 14, which can be moved by approximately 2 mm in an outward radial direction of the wafer W, and three second movable outer peripheral pins 16, which can be moved by approximately 2 mm in the outward radial direction, are used as the plurality of movable outer peripheral pins. The first movable outer peripheral pins 14 and the second movable outer peripheral pins 16 alternate in holding the wafer W during wafer processing, to thereby change holding positions of the wafer W during spin processing while maintaining the posture of the wafer W. This lessens marks of the outer peripheral pins left by etching, and reduces insufficient cleaning or cleaning unevenness.

Figure 3:
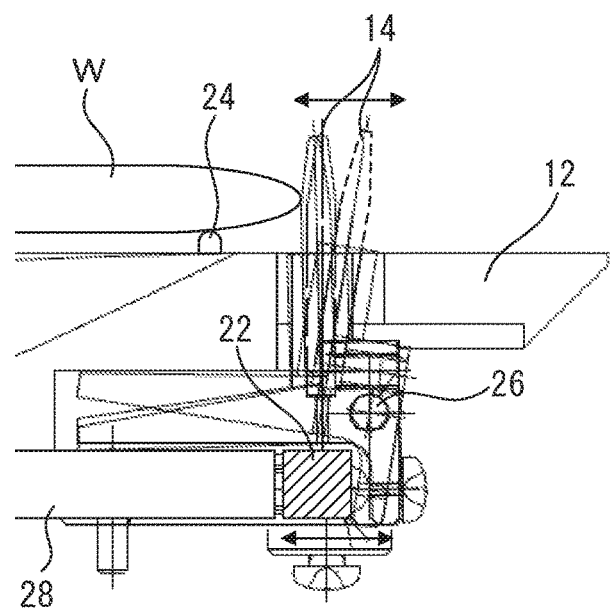
FIG. 3 is an enlarged view of another main part of the wafer rotating and holding device, which comprises the wafer holding mechanism for the rotary table according to the present invention.

How the movable outer peripheral pins are moved to hold the wafer is not limited to a particular method, but it is preferred to control the move with a solenoid 28 provided inside the rotary table 12 as illustrated in FIG. 1 and FIG. 3. A permanent magnet is denoted by a reference symbol 22 and a fulcrum is denoted by a reference symbol 26 in FIG. 1 and FIG. 3. In the illustrated example, the permanent magnet 22 is embedded below a wafer lever to use a lever method in which the wafer lever opens or closes depending on whether the magnetic force of the electromagnet is strong or weak, and which of the first movable outer peripheral pins 14 and the second movable outer peripheral pins 16 hold the wafer is switched by changing the polarity of the electromagnet.

An example of how the movable outer peripheral pins operate to hold the wafer is described below. To feed the wafer W, all of the first movable outer peripheral pins 14 and all of the second movable outer peripheral pins 16 are pulled down in the outward radial direction indicated by the arrow with the use of the solenoid 28. After the wafer W is set, the first movable outer peripheral pins 14 are pulled down in an inward radial direction of the wafer W to hold the wafer W. The rotary table 12 is rotated, and processing, for example, the application of a chemical solution onto the wafer, is started. At the elapse of a certain processing time, the second movable outer peripheral pins 16 are pulled down in the inward radial direction to be ready for wafer holding, and then the first movable outer peripheral pins 14 are pulled down in the outward radial direction to stop holding the wafer W and to let the second movable outer peripheral pins 16 hold the wafer W. During the processing of the wafer W, the first movable outer peripheral pins 14 and the second movable outer peripheral pins 16 are alternated to change positions at which the wafer is held. While the movable outer peripheral pins are driven by changing the polarity of the solenoid with the use of the electromagnet in the illustrated example, a pressure at which the pins are pressed to the wafer may be controlled by changing a voltage applied to the solenoid.

In the illustrated example, the rotary shaft 18 is made of stainless steel (SUS), and the rotary table 12 is made of industrial plastic or other types of synthetic resin. The number of revolutions of the rotary table 12 is not particularly limited, but 100 rpm to 1,000 rpm is preferred.

The shape of the first movable outer peripheral pins 14 and the second movable outer peripheral pins 16 is not particularly limited, but a columnar shape is preferred. The pins in the illustrated example each have a columnar shape that is approximately 3 mm in diameter. A plurality of first movable outer peripheral pins 14 and a plurality of second movable outer peripheral pins 16 are provided, and three or more first movable outer peripheral pins 14 and three or more second movable outer peripheral pins 16 are desired to be provided. The first movable outer peripheral pins 14 and the second movable outer peripheral pins 16 are desired to be arranged evenly. It is preferred in the present invention that all outer peripheral pins for holding the outer periphery of a wafer be movable.

How electric power is supplied to drive the solenoid is not limited to a particular method, and methods that can be used are, for example, one in which electric power is supplied from a battery embedded in the rotary table and motor driving is switched with a centrifugal force obtained by rotating the rotary table, one in which electric power is supplied from the rotary shaft by utilizing a slip ring to start rotation at the same time as electric power feeding, and one in which electric power is supplied to the rotary table with the use of electromagnetic induction to start rotation at the same time as electric power feeding.

Figure 4:
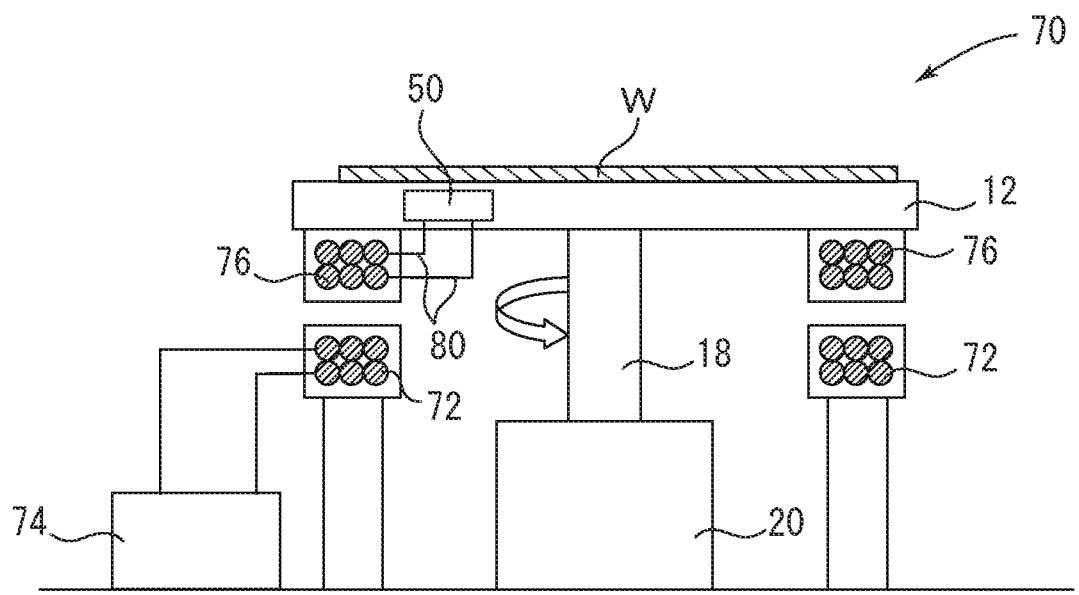
FIG. 4 is a schematic diagram for illustrating a mode of carrying out an electric power supply mechanism, which can be used in the wafer holding mechanism for the rotary table according to the present invention.
Figure 5:
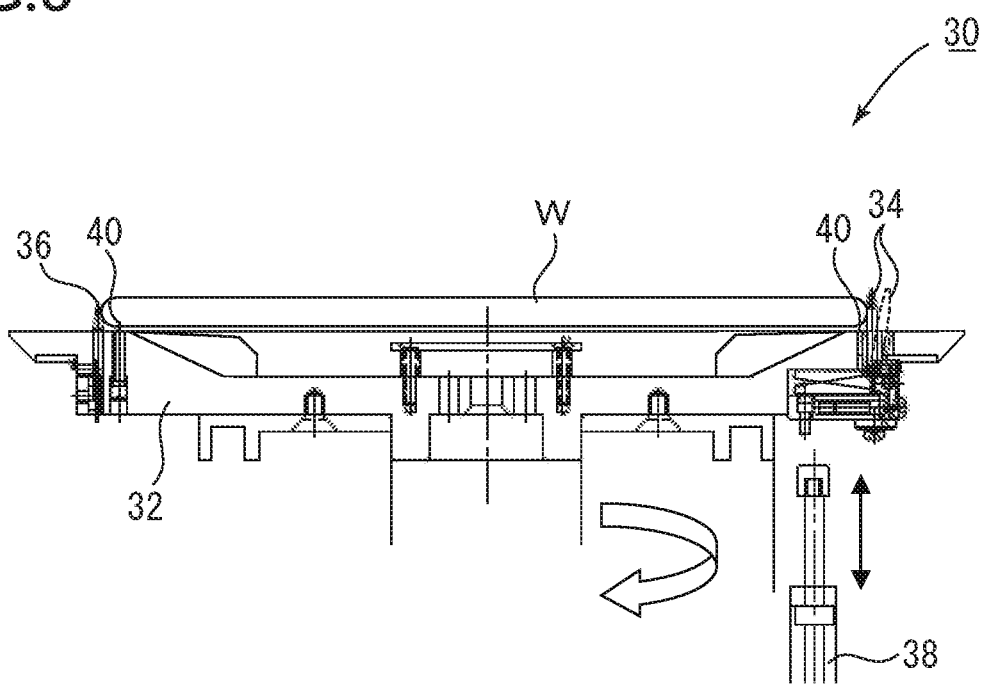
FIG. 5 is a schematic diagram for illustrating a wafer rotating and holding device of the related art.
Figure 6:
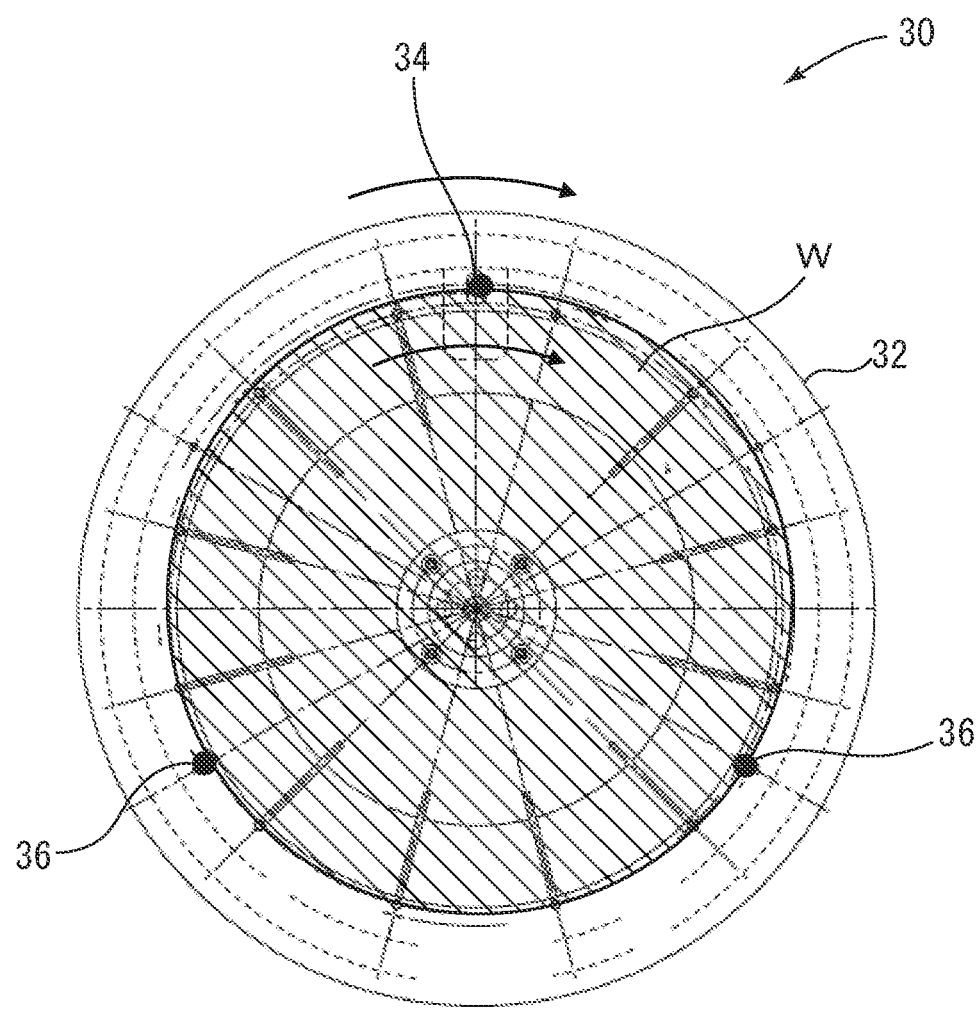
FIG. 6 is an enlarged view of a main part of the wafer rotating and holding device of the related art as shown in FIG. 5.

An electric power supply mechanism 70 is illustrated in FIG. 4 as a mode of carrying out electric power supply means that uses the method of using the electromagnetic induction. The electric power supply mechanism 70 in FIG. 4 comprises: the rotary shaft 18; the rotary table 12 placed on an end of the rotary shaft 18 and configured to hold the wafer W on the upper surface of the rotary table 12; the drive motor 20 configured to supply motive power to the rotary shaft 18; a fixed-side primary coil 72 wound around the rotary shaft 18; an electric power supply source 74 connected to the fixed-side primary coil 72; and a rotary table-side secondary coil 76, which is provided so as to correspond to the fixed-side primary coil 72 and be separated from the fixed-side primary coil 72 by a predetermined distance, and is mounted to the rotary table 12. A rotation control motor is connected to the rotary table-side secondary coil 76 via electric wires 80 so that electric power is supplied to a load 50 of the solenoid and of others by electromagnetic induction via the secondary coil 76.

It is preferred for the wafer rotating and holding device according to the present invention to comprise a spin processing mechanism. The spin processing mechanism is, for example, an etching processing mechanism in a spin etching device, a drying mechanism in a spin drying device, or a coating mechanism in a spin coating device. As other spin processing mechanisms, there can be given, as processing to be performed on a wafer surface in manufacturing processes for a device, in addition to the etching processing mechanism for removing a damaged layer after back-grinding, a mechanism for applying developer to the wafer, a mechanism for performing developing processing on the wafer, which has a surface that has circuit patterns exposed thereon and is applied with developer, and which is printed with a semiconductor circuit, and a mechanism for cleaning the wafer surface, and the like. Chemical solutions to be used in the processing are not particularly limited, and acid-based/alkaline-based etching cleaning liquids and rinse water can be suitably used.

A wafer holding method for a rotary table according to the present invention is a method of holding a wafer with the use of the wafer holding mechanism for the rotary table. The wafer rotating and holding device is a device comprising the wafer holding mechanism for the rotary table.

REFERENCE SIGNS LIST

10: wafer holding mechanism for rotary table according to the present invention, 11: wafer rotating and holding device according to the present invention, 12, 32: rotary table, 14: first movable outer peripheral pin, 16: second movable outer peripheral pin, 18: rotary shaft, 20: drive motor, 22: permanent magnet, 24, 40: support pin, 26: fulcrum, 28: solenoid, 30: wafer rotating and holding device of the related art, 34: movable pin, 36: fixed pin, 38: cylinder, 50: load, 70: electric power supply mechanism, 72: fixed-side primary coil, 74: electric power supply source, 76: rotary table-side secondary coil, W: wafer.

The invention claimed is:

1. A wafer holding mechanism for a rotary table of a wafer rotating and holding device, the wafer holding mechanism comprising:
　　a rotary shaft;
　　a rotary table placed on an end of the rotary shaft and the rotary table being configured to hold a wafer on an upper surface of the rotary table;
　　a drive motor configured to supply motive power to the rotary shaft; and
　　a plurality of movable outer peripheral pins provided in the rotary table and the plurality of movable outer peripheral pins being configured to hold an outer periphery of the wafer, wherein the plurality of movable outer peripheral pins comprise a plurality of first movable outer peripheral pins and a plurality of second movable outer peripheral pins, the plurality of second movable outer peripheral pins being configured to hold the wafer at positions different from holding positions of the wafer by the plurality of first movable outer peripheral pins, wherein the plurality of second movable outer peripheral pins are configured to avoid holding the wafer during a period in which the plurality of first movable outer peripheral pins are holding the wafer, and the plurality of first movable outer peripheral pins are configured to avoid holding the wafer during a period in which the plurality of second movable outer peripheral pins are holding the wafer, wherein holding positions of the wafer are changed by switching holding by the first movable outer peripheral pins and holding by the second movable outer peripheral pins during processing of the wafer, wherein the holding of the wafer by the plurality of movable outer peripheral pins is controlled with a solenoid, the solenoid being provided inside the rotary table.

2. A wafer holding method for a rotary table, the method comprising:
　　using a wafer holding mechanism for the rotary table to hold a wafer, the wafer holding mechanism comprising:
　　　　a rotary shaft, the rotary table being placed on an end of the rotary shaft and the rotary table being configured to hold a wafer on an upper surface of the rotary table;
　　　　a drive motor configured to supply motive power to the rotary shaft; and
　　　　a plurality of movable outer peripheral pins provided in the rotary table and the plurality of movable outer peripheral pins being configured to hold an outer periphery of the wafer, wherein the plurality of movable outer peripheral pins comprise a plurality of first movable outer peripheral pins and a plurality of second movable outer peripheral pins, the plurality of second movable outer peripheral pins being configured to hold the wafer at positions different from holding positions of the wafer by the plurality of first movable outer peripheral pins, wherein the plurality of second movable outer peripheral pins are configured to avoid holding the wafer during a period in which the plurality of first movable outer peripheral pins are holding the wafer, and the plurality of first movable outer peripheral pins are configured to avoid holding the wafer during a period in which the plurality of second movable outer peripheral pins are holding the wafer, wherein holding positions of the wafer are changed by switching holding by the first movable outer peripheral pins and holding by the second movable outer peripheral pins during processing of the wafer, wherein the holding of the wafer by the plurality of movable outer peripheral pins is controlled with a solenoid, the solenoid being provided inside the rotary table.

3. A wafer rotating and holding device, comprising:
a wafer holding mechanism for a rotary table, the wafer holding mechanism comprising:
   a rotary shaft, the rotary table being placed on an end of the rotary shaft and the rotary table being configured to hold a wafer on an upper surface of the rotary table;
   a drive motor configured to supply motive power to the rotary shaft; and
   a plurality of movable outer peripheral pins provided in the rotary table and the plurality of movable outer peripheral pins being configured to hold an outer periphery of the wafer, wherein the plurality of movable outer peripheral pins comprise a plurality of first movable outer peripheral pins and a plurality of second movable outer peripheral pins, the plurality of second movable outer peripheral pins being configured to hold the wafer at positions different from holding positions of the wafer by the plurality of first movable outer peripheral pins, wherein the plurality of second movable outer peripheral pins are configured to avoid holding the wafer during a period in which the plurality of first movable outer peripheral pins are holding the wafer, and the plurality of first movable outer peripheral pins are configured to avoid holding the wafer during a period in which the plurality of second movable outer peripheral pins are holding the wafer, wherein holding positions of the wafer are changed by switching holding by the first movable outer peripheral pins and holding by the second movable outer peripheral pins during processing of the wafer, wherein the holding of the wafer by the plurality of movable outer peripheral pins is controlled with a solenoid, the solenoid being provided inside the rotary table.

* * * * *